United States Patent [19]

Anderson et al.

[11] 4,253,731
[45] Mar. 3, 1981

[54] INFRARED FIBER OF AGCL CLAD AGBR AND METHOD OF FABRICATION

[75] Inventors: Rogers H. Anderson, Bloomington; Enrique B. G., Minnetonka; Di Chen, Hopkins, all of Minn.

[73] Assignee: Honeywell Inc., Minneapolis, Minn.

[21] Appl. No.: 27,958

[22] Filed: Apr. 9, 1979

[51] Int. Cl.³ ............................................. G02B 5/14
[52] U.S. Cl. .......................... 350/96.34; 264/1.5; 264/176 F; 350/96.30
[58] Field of Search .................. 350/1.1, 1.4, 96.30, 350/96.32, 96.34; 264/1, 171, 174, 176 R, 176 F, DIG. 19; 65/2, 3 R

[56] References Cited

U.S. PATENT DOCUMENTS

| | | | |
|---|---|---|---|
| 3,551,051 | 12/1970 | Salgo | 350/1.4 X |
| 3,853,384 | 12/1974 | Pinnow et al. | 350/96.31 |
| 4,089,586 | 5/1978 | French et al. | 350/96.30 |
| 4,171,400 | 10/1979 | Rosette et al. | 350/1.1 X |

FOREIGN PATENT DOCUMENTS 2821642  11/1978  Fed. Rep. of Germany ........ 350/96.34

OTHER PUBLICATIONS

Kapany, "Infrared Fiber Optics", 1959 Yearly Report-Contract No. AF33(616)-6247, pp. 3-5, 10, 11.
Kapany, "Infrared Fiber Optics", Quarterly Report (5)-Contract No. AF33(616)-6247, Jun. 1960, pp. 1-3.
Lussier, "Guide To IR-Transmissive Materials", *Laser Focus*, vol. 12, No. 12, Dec. 1976, pp. 47-50.
Pinnow et al, "Polycrystalline Fiber Optical Waveguides For Infrared Transmission", *Appl. Phys. Lett.*, vol. 33, No. 1, Jul. 1978, pp. 28-29.

*Primary Examiner*—John K. Corbin
*Assistant Examiner*—John D. Lee
*Attorney, Agent, or Firm*—Omund R. Dahle

[57] ABSTRACT

An infrared fiber of a silver chloride clad silver bromide core fabricated by an extrusion process in which both core and cladding are extruded.

12 Claims, 4 Drawing Figures ered image and signal transmission. FIG. 1 discloses a new infrared fiber 10 having a AgBr core 11 and a AgCl cladding 12 for use in such IR work. At 10.6 μm wavelength, the refractive index of these two materials are 2.0 for AgBr and 1.98 for AgCl resulting in a clad fiber of a numerical aperture ($NA = \sqrt{2 \cdot n\Delta n}$) of approximately 0.28 and is suitable for many image and signal transmission applications. Table I shows a summary of optical properties of these halide materials.

INFRARED FIBER OF AGCL CLAD AGBR AND METHOD OF FABRICATION

BACKGROUND AND SUMMARY OF THE INVENTION

In the past, fabrication of visible or near infrared transmitting glass (silica) fibers with a suitable cladding has been advanced by several manufacturers. The cutoff wavelengths for glass fibers, however, precludes its use for infrared transmission. The publication "Polycrystalline Fiber Optical Waveguide for Infrared Transmission" by Pinnow, Gentile, Standke and Timper, Applied Physics Letter 33(1), July 1, 1978, Pages 28-9, describes fiber optic waveguide cores of polycrystalline thallium bromide and thallium bromoiodide (KRS-5), the cores being inserted into a loose fitting polymer cladding. These materials have some solubility in water however, which is a disadvantage.

In the present invention, an infrared optic fiber is described in which both the core and the cladding of the optic fiber are of a halide material and the clad fiber is fabricated by an extrusion procedure. In one example, silver chloride (AgCl) clad silver bromide (AgBr) is described. AgCl and AgBr are virtually insoluble in water which is a strong advantage. The fundamental phonon absorption bands are in the far infrared making them a good choice. Furthermore, at elevated temperatures, halide materials become plastic and deform in a manner similar to metals. Consequently, it is possible to perform metal-like working operations on them such as extrusion, rolling and forging. In order to produce a fine-grained polycrystalline material by deformation of a single crystal or polycrystal billet, the billet must be at a temperature high enough to permit a generalized deformation. This temperature should not be so high, however, that substantial grain growth occurs, since the desired result in the extruded fiber is a fine-grained material. In AgCl the preferred temperature range is between about 20° C. and about 300° C. and in AgBr the preferred temperature range is between about 15° C. and about 300° C. Fiber extrusion at room temperature (about 20° C.) has proved feasible to provide a fine-grained optical fiber of AgCl clad AgBr.

DETAILED DESCRIPTION

Infrared transmitting fiber optics are useful for infra-

TABLE I

SUMMARY OF OPTICAL PROPERTIES OF HALIDE MATERIALS

| Material | Transmission Range (μm) | Refractive Index* | Absorption Coeff. (cm$^{-1}$) | Crystal Structure |
|---|---|---|---|---|
| AgCl | .5-20 | 1.98 | .005 | Cubic (NaCl) |
| AgBr | .5-25 | 2. | .005 | Cubic (NaCl) |

*At 10.6μm wavelength

Thus, it can be seen that both materials operate into the IR range and that they both have the NaCl type of cubic crystal structure.

Experimental measurements indicate that the optical loss in the fiber is strongly dependent on the grain size. Generally, the smaller the grain size, the lower the fiber loss. Therefore, it is essential to be able to control the fiber grain size. Fine grain size is herein defined as less than about 20 microns and preferably about 1-3 microns. To perform the extrusion we have constructed a differential pressure extrusion machine, with a capability of up to 400,000 pounds/inch squared pressure in the extrusion chamber which can be heated to the desired temperature. The speed of extrusion is also controllable with high precision. The machine allows extruding of silver halides even at room temperature.

Figure 1:
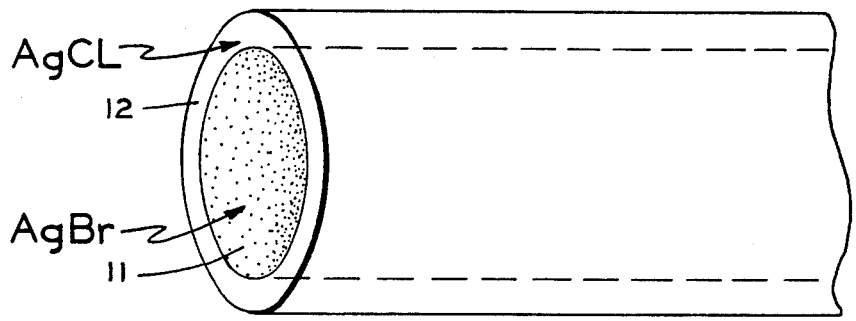
FIG. 1 is a geometrical representation of a AgBr fiber clad with AgCl.
Figure 2:
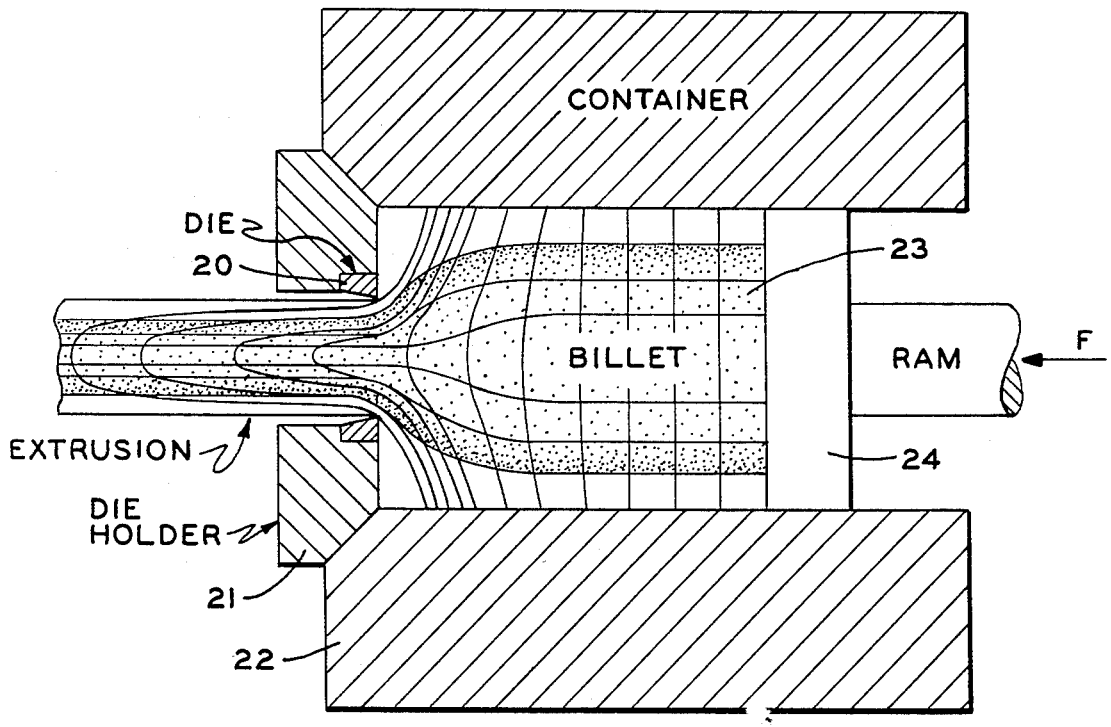
FIG. 2 is a diagrammatic sketch of extruding apparatus to produce the fiber of FIG. 1.
Figure 3:
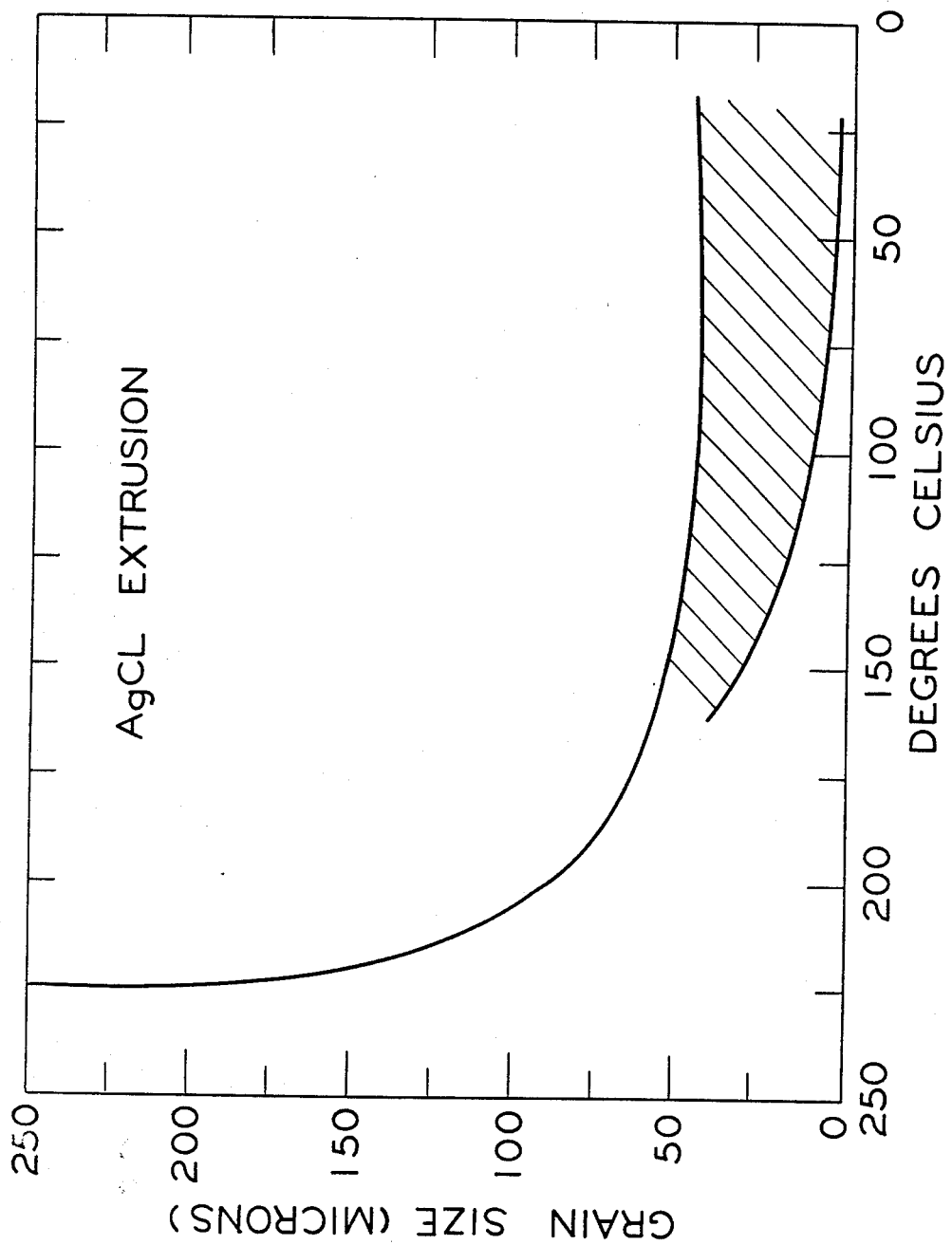
FIG. 3 is a graphical presentation of grain size vs. temperature in a AgCl extrusion. The shaded region indicates that the result also depends on extrusion rate in the range given in Table II.
Figure 4:
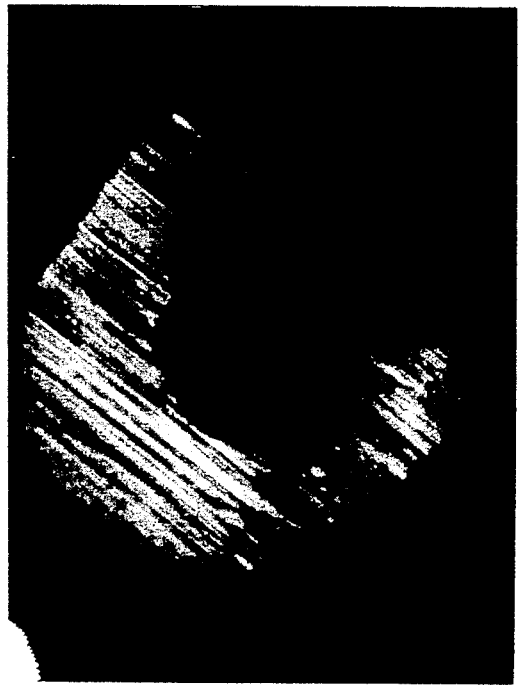
FIG. 4 is a photograph of the AgCl clad AgBr fiber.

In FIG. 2 there is shown apparatus for extruding the clad optic fiber 10. A diamond die 20 in a die holder 21 is affixed to a cylindrical container 22 which encloses the coaxial billet 23 to be extruded when a force F is applied at ram 24. For example, we have used dies sized to extrude fibers from 3 to 18 mils in diameter. In the case of an extruded clad fiber such as is shown in FIG. 1, the coaxial billet 23 comprises a cylindrical body or sleeve of AgCl surrounding a rod or core of AgBr snugly fit within it. In one laboratory example, this preformed billet comprised a single crystal AgCl billet which was axially drilled out to a diameter to receive a AgBr single crystal core section. In this example the AgCl sleeve had an outer diameter of ¼" and was drilled out to receive a ⅛" AgBr core section. The preform billet is oriented in the press to axially align the core and sleeve in the direction of extrusion. The resulting extruded clad fibers are found to be fine grain polycrystalline in nature, with the average grain size being strongly dependent on extrusion temperature, extrusion rate and other preparation conditions. The ratio of core to cladding of the billet is generally followed in the extruded fiber. A range of temperatures and extrusion rates have been used in the extruding process and the graph of FIG. 3 demonstrates the dependence of the grain size for AgCl as a function of the extrusion temperature. The lower temperature areas of the graph are to be preferred. It is also found that in order to achieve fine-grained ($\sim$1-3/μm) fibers a low extrusion rate is desirable. Table II shows extrusion variables which have been tried for AgCl and AgBr including extrusion rates, pressure and temperature, the die diameter, the light transmission loss at 14 μm and the cutoff wavelength.

While extruding a preformed billet comprising a AgBr core and a AgCl sleeve into a cladded fiber has been described in detail, it is also possible to coat, indiffuse, or deposit AgCl over the AgBr fiber.

TABLE II

| | | INFRARED FIBER EXTRUSION EXPERIMENTS | | | | |
|---|---|---|---|---|---|---|
| MATERIALS | DIAMETER (MILS) | RATE (IN/MIN) | PRESSURE (PSI) | TEMPERATURE (°C.) | TRANSMISSION AT 14μM (DB/CM) | CUT-OFF WAVELENGTH (μM) |
| AgCl | 6–18 | 0.2–25 | 260,000 to 280,000 | 20–310 | 0.06–1 | 20 |
| AgBr | 10–18 | 0.3–25 | 260,000 to 280,000 | 15–315 | .045–1 | 28 |

The embodiments of the invention in which an exclusive property or right is claimed are defined as follows:

1. The method of producing a AgCl clad AgBr optic fiber comprising the steps of:
   providing a coaxial two-part preform billet having an axial core of crystalline AgBr and a sleeve of crystalline AgCl surrounding said core;
   orienting said two-part billet in an extruding press to axially align said core and sleeve with the direction of extrusion;
   bringing said preform billet to a desired temperature; and,
   applying force to said extruding press at a pressure to extrude therefrom a coaxial fine-grain optic fiber of AgCl clad AgBr.

2. The method according to claim 1 wherein the billet is brought to the temperature range of about 20° C. to about 300° C.

3. The method according to claim 2 wherein the billet is brought to a temperature of about 20° C.

4. The method according to claim 1 wherein the crystalline AgBr core of the billet is single crystal AgBr.

5. The method according to claim 1 wherein the crystalline AgBr core of the billet is polycrystal AgBr.

6. The method according to claim 4 or 5 wherein the crystalline AgCl sleeve of the billet is single crystal AgCl.

7. The method according to claim 4 or 5 wherein the crystalline AgCl sleeve of the billet is polycrystal AgCl.

8. The method according to claim 1 wherein the pressure is in the range of from about 260,000 psi to about 280,000 psi.

9. The method according to claim 1 wherein the extruding is at a rate in the range of from about 0.2 inches/minute to about 25 inches/minute.

10. An infrared transmissive optic fiber comprising:
    a silver bromide fiber core having a fine-grained crystalline structure clad with a fine-grained silver chloride cladding.

11. The fiber according to claim 10 wherein the refractive index of the silver bromide is 2.0 and the refractive index of the silver chloride is 1.98.

12. The fiber according to claim 10 wherein the grain size of the core and cladding is less than about 3 μm.

* * * * *